(12) United States Patent
Satou et al.

(10) Patent No.: US 8,247,139 B2
(45) Date of Patent: *Aug. 21, 2012

(54) VOLUME HOLOGRAPHIC DATA RECORDING MEDIA

(75) Inventors: Kazuyuki Satou, Settsu (JP); Kazuko Aoki, Settsu (JP); Makoto Hanazawa, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 304 days.

This patent is subject to a terminal disclaimer.

(21) Appl. No.: 12/593,833

(22) PCT Filed: Mar. 28, 2008

(86) PCT No.: PCT/JP2008/056822
§ 371 (c)(1),
(2), (4) Date: Sep. 29, 2009

(87) PCT Pub. No.: WO2008/123612
PCT Pub. Date: Oct. 16, 2008

(65) Prior Publication Data
US 2010/0119957 A1    May 13, 2010

Related U.S. Application Data

(60) Provisional application No. 60/981,266, filed on Oct. 19, 2007.

(30) Foreign Application Priority Data

Mar. 30, 2007  (JP) ................... 2007-094001
Aug. 27, 2007  (JP) ................... 2007-219604

(51) Int. Cl.
*G03H 1/02*    (2006.01)

(52) U.S. Cl. ......... 430/1; 430/2; 359/3; 359/22; 359/24; 359/25

(58) Field of Classification Search .................. None
See application file for complete search history.

(56) References Cited

U.S. PATENT DOCUMENTS

| | | | | | |
|---|---|---|---|---|---|
| 4,963,471 | A | * | 10/1990 | Trout et al. | 430/282.1 |
| 5,098,176 | A | * | 3/1992 | Wolf | 359/11 |
| 5,470,662 | A | * | 11/1995 | Weber et al. | 428/421 |
| 5,712,355 | A | * | 1/1998 | Jones | 526/254 |

(Continued)

FOREIGN PATENT DOCUMENTS

JP    2005-097371    *    4/2005

(Continued)

OTHER PUBLICATIONS

Miura et al., "Three-dimensional shift selectivity in reflection-type holographic memory disk", Appl. Opt., vol. 46(9) pp. 1460-1466 (Mar. 2007).*

(Continued)

*Primary Examiner* — Martin Angebranndt
(74) *Attorney, Agent, or Firm* — Sughrue Mion, PLLC

(57) ABSTRACT

There is provided volume holographic data recording media having a recording layer which is capable of recording interference fringes generated by interference of light having excellent coherence as fringes having different refractive indexes and undergoes holographic data recording by an amount of spatial shift distance of not more than 3 μm which is smaller than that of conventional media.

10 Claims, 10 Drawing Sheets
(2 of 10 Drawing Sheet(s) Filed in Color)

U.S. PATENT DOCUMENTS

| | | | |
|---|---|---|---|
| 2004/0180266 A1* | 9/2004 | Hirao et al. | 430/1 |
| 2005/0018260 A1 | 1/2005 | Hirao et al. | |
| 2006/0176532 A1* | 8/2006 | Toishi | 359/24 |
| 2006/0188790 A1 | 8/2006 | Takizawa et al. | |
| 2006/0194122 A1* | 8/2006 | Takizawa | 430/1 |
| 2006/0233087 A1* | 10/2006 | Usami | 369/103 |
| 2009/0087753 A1* | 4/2009 | Satou et al. | 430/2 |
| 2010/0112460 A1* | 5/2010 | Satou et al. | 430/2 |

FOREIGN PATENT DOCUMENTS

| | | | |
|---|---|---|---|
| JP | 2007-171673 | * | 7/2005 |
| WO | 2007/007436 | * | 1/2007 |

OTHER PUBLICATIONS

Zhang et al. "Compact holographic storage by using a fiber bundle to guide the reference beam", Rev. Laser Eng. vol. 31(11) pp. 758-761 (Nov. 2003).*

* cited by examiner (a)

(b)

(c)

(a)

(b)

(c)

VOLUME HOLOGRAPHIC DATA RECORDING MEDIA

CROSS-REFERENCE TO RELATED APPLICATION

This application claims benefit under 35 U.S.C. §119(e) of U.S. Provisional Application No. 60/981,266 filed on Oct. 19, 2007, incorporated herein by reference in its entirety.

TECHNICAL FIELD

The present invention relates to volume holographic data recording media being capable of multiplex recording of high density.

BACKGROUND ART

Holographic data storage is expected as the most promising candidate for next generation optical data recording system, and various researches have been made. In these researches, holographic photopolymer materials take up their position as an attractive candidate for optical recording materials in write-once-read-many-times-data storage applications because they have a large refractive index contrast, a high recording sensitivity, a high resolution and stability in recording, and in addition, recording media for data storage applications can be constructed by easy processing (for example, refer to H. J. Coufal, D. Psaltis, and G. T. Sincerbox eds. "Holographic Data Storage (Springer Series in Optical Sciences, Vol. 76, p. 10, 2000)", D. A. Waldman, R. T. Ingwall, P. K. Dal, M. G. Horner, E. S. Kolb, H.-Y. S. Li, R. A. Minns, and H. G. Schild, "Cationic ring-opening photopolymerization methods for volume hologram recording", SPIE, vol. 2689, pp. 127-141, 1996, and L. Dhar, K. Curtis, M. Tackitt, M. Schilling, S. Campbell, W. Wilson, A. Hill, C. Boyd, N. Levinos, and A. Harris, "Holographic storage of multiple high-capacity digital data pages in thick photopolymer systems", Opt. Lett., vol. 23, no. 21, pp. 1710-1712, 1998).

On the other hand, methods of angle-multiplex recording have been proposed, and definite results of hologram characteristics have been obtained. However, from the viewpoint of practical use, it is difficult to solve all the problems for improvement of optical recording density by these methods because of instability of recording due to oscillation.

In hologram data recording, in order to read out optical data stored by multiplex recording, it is necessary to record optical data by displacement of an amount of spatial shift distance or more, and a material for multiple recording of high density giving a small amount of spatial shift distance is desired.

DISCLOSURE OF INVENTION

It is an object of the present invention to provide volume holographic data recording media undergoing holographic data recording by an amount of spatial shift distance of not more than 3 μm which is smaller than that of conventional media.

The present invention relates to volume holographic data recording media having a recording layer being capable of recording interference fringes generated by interference of light having excellent coherence as fringes having different refractive indexes, wherein an amount of spatial shift distance of holograms recorded on the recording layer is not more than 3 μm.

Further, the present invention relates to volume holographic data recording media having a reflecting layer and a recording layer on a substrate, wherein a servo pit pattern is formed on the reflecting layer and a pit length is less than 2 μm.

It is preferable that a composition used for the recording layer comprises a fluorine-containing polymer.

It is preferable that a composition used for the recording layer comprises a base polymer (a), a liquid monomer (b) and a photo-initiator (c), in which the base polymer (a) is a non-crystalline polymer comprising a hydrocarbon monomer or a fluorine-containing monomer as a structural unit and having a fluorine content of from 26 to 80% by mass, the liquid monomer (b) comprises at least one kind of liquid monomer (b1) initiating polymerization by activated species generated from the photo-initiator (c), the photo-initiator (c) is a compound which is sensitized by light having excellent coherence, thereby initiating polymerization of the liquid monomer (b1), and a refractive index of the liquid monomer (b) is higher than an average refractive index of a mixture of the base polymer (a) and the photo-initiator (c).

BRIEF DESCRIPTION OF DRAWINGS

The patent or application file contains at least one drawing executed in color. Copies of this patent or patent application publication with color drawings will be provided by the Office upon request and payment of the necessary fee.

BEST MODE FOR CARRYING OUT THE INVENTION

Figure 1:
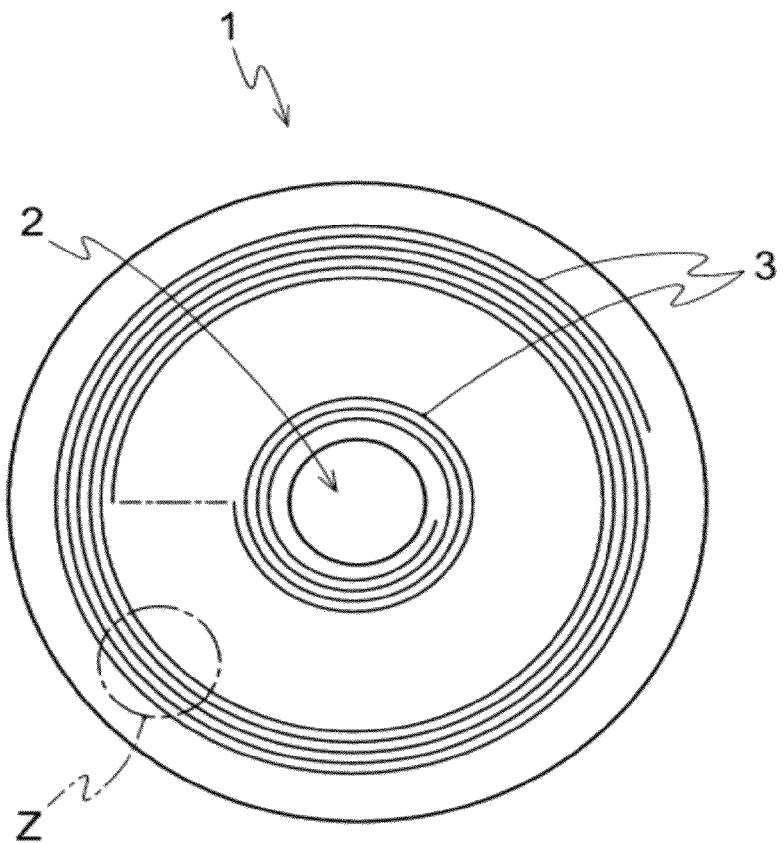
FIG. 1 is a plan view of the optical disc according to the embodiment of the present invention.

The volume holographic data recording media of the present invention is volume holographic data recording media having a recording layer being capable of recording interference fringes generated by interference of light having excellent coherence as fringes having different refractive indexes, and an amount of spatial shift distance of holographic data recorded on the recording layer is not more than 3 μm.

The amount of spatial shift distance means a minimum distance (displacement) enabling reading out of each holographic data stored by multiplex recording to an extent that each holographic data are dividable. Therefore, when the distance between the recorded data is less than the amount of spatial shift distance, read-out of the data becomes difficult. On the other hand, when the distance between the recorded data is more than the amount of spatial shift distance, there is no problem with read-out of the data, but recording density is decreased. The amount of spatial shift distance is greatly affected by a material forming the recording layer.

Outputs of each pixel of reconstructed hologram image is classified into two groups, namely, one group is in the case of a pixel of input SLM (spatial light modulator) being "ON" and another group is in the case of a pixel of input SLM (spatial light modulator) being "OFF". A histogram can be obtained from an output distribution of each group. In addition, SNR can be obtained from the following equation by statistical analyses of the respective "ON" group and "OFF" group of output of each pixel of reconstructed hologram image.

$$SNR = (mean\_ON - mean\_OFF)/(std\_ON^2 - std\_OFF^2)^{1/2}$$

Herein mean_ON and std_ON represent an average output of the "ON" group and a standard deviation of an output of the "ON" group, respectively. This can be applied to the "OFF" group.

In this case, SNR is graduated on an ordinate and a shift pitch size is graduated on an abscissa, and when a graph is drawn, there exists a threshold value where SNR is steeply increased. Such a threshold value can be called an amount of spatial shift distance. The above-mentioned equation of SNR is an important theoretical equation for determining an amount of spatial shift distance (System and Material of Holographic Memory, CMC Shuppan, p. 205).

Examples of multiplex recording methods which can be applied to the volume holographic data recording media of the present invention are speckle-shift hologram multiplexed recording (correlation hologram multiplexed recording), angle-multiplex recording, shift hologram multiplexed recording and phase code hologram multiplexed recording. The recording media of the present invention is explained below by reference of speckle-shift hologram multiplexed recording as a typical example.

Speckle-shift hologram multiplexed recording is a method of, for example, providing a diffusion plate in an optical path for a reference beam and causing interference of the diffused reference beam and a signal beam in a recording material.

Generally, a laser beam subjected to random diffusion causes random interference, and as a result, has a random intensity distribution called a speckle pattern. Namely, in the speckle-shift multiplexed recording method, a speckle pattern and a signal beam undergo interference. The thus recorded hologram has a feature that an image is not read out when displaced by a distance equal to or more than the speckle size. A multiplex method using this feature is speckle-shift hologram multiplexed recording (correlation hologram multiplexed recording), and has an advantage that data is recorded more densely than shift hologram multiplexed recording method using a spherical wave (namely, shift selectivity is good). On the other hand, for increasing recording density, an amount of spatial shift distance is required to be decreased irrespective of a speckle size.

The amount of spatial shift distance is not more than 3 μm, preferably less than 3 μm from the viewpoint of increasing recording density. In addition, a smaller amount of spatial shift distance is preferable from the viewpoint of increasing recording density. Specifically the amount of spatial shift distance is preferably not more than 1 μm, and it can be considered that a lower limit is about 0.3 μm from the viewpoint of a limit of laser beam wavelength, kind of material and processing.

Then a speckle-shift hologram multiplexed recording method in an optical disc having a track is explained below as an example of the volume holographic data recording media of the present invention.

In the speckle-shift hologram multiplexed recording, a signal beam and a reference beam are condensed and emitted via an objective lens to a recording spot of a specific size in a given part of a recording layer to generate an interference fringe by beam interference and simultaneously record the interference fringe in the recording layer. In such a manner, each data per recording spot is recorded in the form of interference fringe successively in the recording layer at a specified distance in the same track. Next, light emission of the signal beam and the reference beam is shifted by a specified recording pitch from the first recording portion on the recording layer, and the recording of the second track is made on the first recording in the same manner as in the first recording. After completion of the second recording on one round of the track, further light emission of the signal beam and the reference beam is shifted by a specified recording pitch, and the recording of the third round is made on the first and second recording. Thus light emission or recording layer is shifted in order to record repeatedly. This is speckle-shift hologram multiplexed recording. In addition, the recorded portion is fixed with fixing beam in a fixing step.

The above-mentioned recording pitch is preferably a minimum distance, namely, an amount of spatial shift distance in which when a signal beam is emitted to the first recording (hologram), the neighboring second recording is not reacted by the signal beam.

In the case of a collinear recording where the signal beam and the reference beam are emitted so that optical axes thereof are in a coaxial line, the distance between the neighboring holograms is larger than the above-mentioned amount of spatial shift distance. For example, when the amount of spatial shift distance is 0.3 μm, the distance between the neighboring holograms is not less than 0.3 μm, and when the amount of spatial shift distance is 3 μm, the distance between the neighboring holograms is not less than 3 μm. If the distance between the neighboring holograms is in the above-mentioned range, no reaction occurs on the neighboring hologram, but if the distance between the neighboring holograms is too large, recording density is decreased. Therefore, the distance is preferably up to 10 μm.

The shift recording method in the above-mentioned speckle-shift hologram multiplexed recording is not specifically limited, and can be optionally selected depending on purpose. For example, there is a method of shifting a disk-like optical recording medium in a direction parallel to the disc plane toward a rotating direction of the optical recording medium (circumferential direction).

In addition, an optical recording medium in the form of card can be used.

A shift recording device of the above-mentioned speckle-shift hologram multiplexed recording is not specifically limited, and can be optionally selected depending on purpose. For example, there are a tracking servo, DLP (Digital Light Processing) and the like explained infra.

In addition to the speckle-shift hologram multiplexed recording, as mentioned above, there are angle-multiplex recording, shift hologram multiplexed recording and phase code hologram multiplexed recording.

Further, in addition to collinear holography where the signal beam and the reference beam are emitted so that the optical axes thereof are in a coaxial line, a coaxial recording method, a polytopic multiplexing method and an off-axis recording method are applicable.

In the volume holographic data recording media of the present invention, for adjusting an amount of spatial shifting distance of the recording layer to be not more than 3 μm, a fluorine-containing material is used as a material for forming the recording layer. For example, a composition to be used is a composition used on a volume holographic data recording media for recording interference fringes generated by interference of light having excellent coherence as fringes having different refractive indexes and comprises the base polymer (a), the liquid monomer (b) and the photo-initiator (c).

Example of the light having excellent coherence is one obtained by passing monochromatic light such as laser beam or sodium lamp light through a pin hole, and laser beam is preferable because it is light having very high coherence from the viewpoint of space and time.

The base polymer (a) is one comprising a hydrocarbon monomer or a fluorine-containing monomer as a structural unit since a difference in refractive index from other monomer can be made large. Further, the base polymer (a) is a non-crystalline polymer since it has satisfactory compatibility with other monomer, photo-initiator and dye sensitizer even in the case of high fluorine content in the absence of a solvent and can improve dynamic range M/# and recording sensitivity. The base polymer (a) differs from polytetrafluoroethylene (PTFE) and polyvinylidene fluoride (PVdF).

When the base polymer (a) comprises a fluorine-containing monomer as a structural unit, its fluorine content is from 26 to 80% by mass, preferably from 30 to 65% by mass. When the fluorine content of the base polymer (a) is smaller, there are problems that a difference in refractive index is small and the media lacks diffraction efficiency, dynamic range M/# and recording sensitivity, and when the fluorine content of the base polymer (a) is larger, there are problems that uniform interference fringe of hologram cannot be formed and phase separation of each hologram composition and light scattering occur, thereby generating recording noise.

The base polymer (a) may be a polymer having a cure site or a polymer having no cure site. From the viewpoint of improvement of recording sensitivity, archival recording property and excellent light fastness, a polymer having a cure site is preferable.

Examples of preferable base polymer (a) are, for instance, hydrocarbon polymers or fluorine-containing polymers.

In addition to those exemplified above, for example, it is possible that the base polymer (a) used in the present invention is one having a cure site and the composition of the present invention for volume holographic data recording material comprises a polyfunctional unsaturated compound (d) being capable of crosslinking reaction with the cure site by heat.

With respect to a combination of the base polymer (a) having a cure site and the polyfunctional unsaturated compound (d), there can be optionally selected and used at least one of combinations such as a compound having isocyanate group with a compound having hydroxyl group, a compound having isocyanate group with a compound having amino group, a compound having carbodiimide group and a compound having carboxyl group, a compound having unsaturated ester group with a compound having amino group, a compound having unsaturated ester group with a compound having mercaptan group, a compound having vinyl group with a compound having silicon hydride group, a compound having cationic reaction group with a compound having cationic reaction group, a compound having cationic reaction group with a compound having mercaptan group, a compound having cationic reaction group with a compound having hydroxyl group, a compound having cationic reaction group with a compound having amino group, a compound having cationic reaction group with a compound having silicon hydride group, and a compound having cationic reaction group with a compound having carboxyl group. Among the above-mentioned combinations, combination of the polyfunctional unsaturated compound (d) having isocyanate group with the base polymer (a) having hydroxyl group is more preferable since polymerization or crosslinking can be carried out under moderate conditions.

The polyfunctional unsaturated compound (d) having isocyanate group which can be used in the present invention is not specifically limited, and the polyfunctional unsaturated compound (d) having two or more isocyanate groups in its molecule is more preferable in order to store recorded holograms sufficiently and improve recording sensitivity. These isocyanate compounds may be used alone or may be used in combination of two or more thereof.

The volume holographic data recording media having a laminated recording layer comprising a composition for volume holographic data recording material is possibly left in a state of the data being stored, under various temperature conditions under fluorescent light, near a window, and the like. Therefore, it is preferable that coloration of the recording layer is inhibited under various environmental conditions. In order to inhibit coloration, aliphatic isocyanate compounds are preferable among compounds having isocyanate group.

In the present invention, when using a compound having isocyanate group, a binder may be formed by self-crosslinking of a compound having isocyanate group, but in order to carry out formation of a binder under moderate conditions, it is preferable to form a binder by crosslinking reaction of an isocyanate compound with a compound having, in its molecule, a functional group reactable with the isocyanate group of the isocyanate compound. Examples of such a compound reactable with an isocyanate compound are a compound having hydroxyl group in its molecule, a compound having a primary or secondary amino group and a compound having enamine form. However when the volume holographic data recording media having a laminated recording layer comprising a composition for volume holographic data recording material is used in a state of the data being stored, in order to inhibit coloration of the volume holographic data recording media, among the above-mentioned compounds, a base polymer (a) having hydroxyl group is preferable as a compound reactable with an isocyanate compound, and more preferable is a base polymer (a) having at least one alcoholic hydroxyl group in its molecule.

In the volume holographic data recording media of the present invention, a refractive index of the base polymer (a) is preferably from 1.350 to 1.385, more preferably from 1.360 to 1.370 from the viewpoint of increasing a difference in refractive index more and improving recording sensitivity and recording density.

In the volume holographic data recording media of the present invention, the content of the base polymer (a) is preferably from 20 to 80% by mass, more preferably from 25 to 60% by mass from the viewpoint of improvement of recording sensitivity, dynamic range and recording density and from the viewpoint of light fastness.

The liquid monomer (b) used in the present invention is one comprising at least one kind of liquid monomer (b1) which initiates polymerization with activated species generated from the photo-initiator (c) explained infra.

Examples of the liquid monomer (b1) are compounds having fluoroacryloyl group.

Both of radically polymerizable compounds and cationically polymerizable compounds can be used as the liquid monomer (b1). Examples of preferable radically polymerizable compounds are those having α-fluoroacryloyl group or acryloyl group from the viewpoint of recording sensitivity and dynamic range. Also, examples of preferable cationically polymerizable compounds are those having an organic group represented by the formula (1) or (2) from the viewpoint of decreasing shrinkage percentage and maintaining hologram storage stability.

An organic group having 1 to 5 crosslinkable cyclic ether structures and 2 to 100 carbon atoms and represented by:

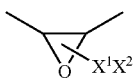

(1)

wherein $X^1$ and $X^2$ are the same or different and each is H, F, an alkyl group having 1 to 6 carbon atoms or a fluorine-containing alkyl group having 1 to 6 carbon atoms.

An organic group represented by:

(2)

wherein Q is a monovalent or divalent organic group of monocyclic structure, polycyclic structure or heterocyclic structure having 3 to 100 carbon atoms, in which hydrogen atom may be replaced by the above-mentioned $X^1$ or $X^2$.

From the viewpoint of improvement of light fastness and hologram storage stability, polyfunctional monomers are preferable as the liquid monomer (b1).

In the composition for the recording layer of the volume holographic data recording media of the present invention, the molecular weight of the liquid monomer (b1) is preferably not less than 50, more preferably not less than 100 from the viewpoint of improving recording sensitivity and dynamic range and decreasing a shrinkage percentage. In addition, the molecular weight of the liquid monomer (b1) is preferably not more than 3,000, more preferably not more than 2,000, further preferably not more than 1,000.

In the composition for the volume holographic data recording material of the present invention, a refractive index of the liquid monomer (b1) is preferably from 1.40 to 1.70, more preferably from 1.45 to 1.68 from the viewpoint of a difference in refractive index, recording sensitivity and dynamic range.

In addition, it is necessary that the refractive index of the liquid monomer (b1) is higher than an average refractive index of a mixture of the base polymer (a), the photo-initiator (c) explained infra and a plasticizer (b2) to be added if necessary, in order to increase a degree of refractive index modulation of the obtained volume hologram.

In the composition for the volume holographic data recording material of the present invention, the content of the liquid monomer (b1) is preferably from 30 to 90% by mass, more preferably from 45 to 80% by mass from the viewpoint of improvement of recording sensitivity, recording stability and dynamic range.

Further, the liquid monomer (b1) is not limited to single use of those exemplified above, and two or more of them may be selected for combination use.

Examples of combination of the liquid monomers (b1) are a combination of a liquid monomer having α-fluoroacryloyl group or acryloyl group with a liquid monomer having methacryloyl group or vinyl group, a combination of a liquid monomer having an organic group represented by the formula (1) or (2) with a liquid monomer having an organic group represented by the formula (3) or (4), namely, an organic group having 1 to 5 crosslinkable cyclic ether structures and 3 to 100 carbon atoms and represented by the formula (3):

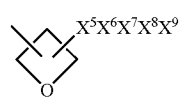

(3)

wherein $X^5$ to $X^9$ are the same or different and each is H, F, an alkyl group having 1 to 6 carbon atoms or a fluorine-containing alkyl group having 1 to 6 carbon atoms, or an organic group represented by the formula (4):

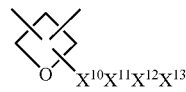

(4)

wherein $X^{10}$ to $X^{13}$ are the same or different and each is H, F, an alkyl group having 1 to 6 carbon atoms or a fluorine-containing alkyl group having 1 to 6 carbon atoms,
and further a combination of a liquid monomer having α-fluoroacryloyl group or acryloyl group or a liquid monomer having methacryloyl group or vinyl group with a liquid monomer having an organic group represented by the formula (1), (2), (3) or (4). Especially from the viewpoint of making recording sensitivity and shrinkage percentage compatible with dynamic range, a combination of a liquid monomer having α-fluoroacryloyl group or acryloyl group with a liquid monomer having methacryloyl group or vinyl group and a combination of a liquid monomer having an organic group represented by the formula (1) or (2) with a liquid monomer having an organic group represented by the formula (3) or (4) are preferable.

In addition to the above-mentioned liquid monomer (b1), it is usually preferable to use the plasticizer (b2) together as the monomer (b) from the viewpoint of improvement of recording sensitivity and dynamic range.

Examples of the plasticizer (b2) are, for instance, inactive compounds such as phthalic acid esters represented by dimethyl terephthalate, diethyl terephthalate, dimethyl phthalate and dioctyl phthalate; aliphatic dibasic acid esters represented by dimethyl adipate, diethyl adipate, dibutyl adipate, dimethyl sebacate, diethyl sebacate, dibutyl sebacate and diethyl succinate; phosphoric acids represented by trimethyl phosphate, triethyl phosphate, triphenyl phosphate and tricresyl phosphate; acetic esters represented by glyceryl triacetate and 2-ethylhexyl acetate; phosphorous esters represented by triphenyl phosphite and dibutylhydrogen phosphite, and 2-ethoxyethyl acetate.

In addition, there can be used alkylene glycol alkyl ethers represented by the following formula (5):

$$R^1(CH_2CH_2O)_\zeta R^2 \quad (5)$$

wherein $R^1$ and $R^2$ are the same or different and each is an alkyl group having 1 to 5 carbon atoms, hydroxyl group or an acetyl group; $\zeta$ is an integer of 1 to 5.

Also, silicone oil or polyethylene glycol having a weight average molecular weight of not more than 10,000 can be used.

It is preferable to select the plasticizer (b2) having a refractive index as close to a refractive index of the base polymer (a) as possible.

The compounds exemplified above as the plasticizer (b2) may be used alone or may be used in combination of two or more thereof. The plasticizer (b2) is not limited to those exemplified above, and 2-ethoxyethyl acetate, diethyl sebacate and diethyl adipate are preferable from the viewpoint of improving recording sensitivity and decreasing shrinkage percentage.

In the composition for the recording layer of the volume holographic data recording media of the present invention, the molecular weight of the plasticizer (b2) is preferably from 100 to 1,000, more preferably from 200 to 800 from the viewpoint of viscosity of the composition, and for improving recording sensitivity and dynamic range and decreasing a shrinkage percentage.

In the composition for the recording layer of the volume holographic data recording media of the present invention, a refractive index of the plasticizer (b2) is preferably from 1.40 to 1.50, more preferably from 1.42 to 1.45 from the viewpoint of improving recording sensitivity and dynamic range.

In the composition for the recording layer of the volume holographic data recording media of the present invention, the content of the plasticizer (b2) is preferably from 0 to 80% by mass, more preferably from 20 to 60% by mass from the viewpoint of viscosity of the composition, and for improving recording sensitivity and dynamic range and decreasing a shrinkage percentage.

The photo-initiator (c) used in the present invention is a compound which is sensitized with light having excellent coherence, thereby initiating polymerization of the liquid monomer (b1).

Examples of suitable photo-initiator (c) are those generating radical by absorbing laser beam such as He—Ne (wavelength 633 nm), Ar (wavelength 515, 488 nm), YAG or Nd:YVO4 (wavelength 532 nm), He—Cd (wavelength 442 nm), AlGaN or InGaN (wavelength 405±5 nm) or frequency-tripled Nd:YAG lasers (wavelength 355 nm).

Nonlimiting examples of photoradical initiator which can be used as the photo-initiator (c) are, for instance, known initiators described in U.S. Pat. Nos. 4,766,055, 4,868,092, 4,965,171, JP54-151024A, JP58-15503A, JP58-29803A, JP59-189340A, JP60-76735A, JP1-287105A, and "PROCEEDINGS OF CONFERENCE ON RADIATION CURING ASIA" (pp. 461-477, 1988). Examples of photoradical initiator which can be used as the photo-initiator (c) are, for instance, diaryl iodonium salts, 2,4,6-substituted-1,3,5-triadines and organic peroxides described in JP58-29803A and JP1-2871Q5A. When high photosensitivity is required, use of diaryl iodonium salts is especially preferable.

It is possible to partly polymerize at least either the cationically polymerizable liquid monomer (b1) or the radically polymerizable liquid monomer (b1) by sensitization with light used for pre-exposure having a wavelength different from that of light used for two-beam interference method. The photo-initiator (c) used in that case is an initiator which is sensitized with light having a wavelength different from that of light used for the above-mentioned exposure of interference fringes and acts as a photoradical polymerization initiator and/or photocationic polymerization initiator on at least either the cationically polymerizable liquid monomer (b1) or the radically polymerizable liquid monomer (b1). At least either the cationically polymerizable liquid monomer (b1) or the radically polymerizable liquid monomer (b1) is partly polymerized by an action of the photo-initiator in the pre-exposure. The "partly polymerized" means a state that at least either the cationically polymerizable liquid monomer (b1) or the radically polymerizable liquid monomer (b1) is polymerized while unreacted compounds of the cationically polymerizable liquid monomer (b1) and the radically polymerizable liquid monomer (b1) are left.

Specifically this state includes:

the case where the cationically polymerizable liquid monomer (b1) is polymerized substantially completely, and the radically polymerizable liquid monomer (b1) is not polymerized or partly polymerized, the case where the radically polymerizable liquid monomer (b1) is polymerized substantially completely, and the cationically polymerizable liquid monomer (b1) is not polymerized or partly polymerized, the case where only a part of the cationically polymerizable liquid monomer (b1) is polymerized, and the radically polymerizable liquid monomer (b1) is not polymerized, the case where only a part of the radically polymerizable liquid monomer (b1) is polymerized, and the cationically polymerizable liquid monomer (b1) is not polymerized, and the case where both of the cationically polymerizable liquid monomer (b1) and the radically polymerizable liquid monomer (b1) are partly polymerized.

As a result of the polymerization by the pre-exposure, the composition is cured to such an extent as to maintain its solidity without flowing out when a photo-sensitizing layer comprising a photo-sensitive composition is placed horizontally. Preferably a polymerizable compound to be polymerized by the pre-exposure is different from a polymerizable compound to be polymerized by the following two-beam interference method, and in this case, more satisfactory recording of interference fringes can be exhibited.

Among the photo-initiators (c), examples of a compound which is sensitized with light used for the pre-exposure and functions as a photoradical polymerization initiator are, for instance, the above-mentioned photo-initiators, titanocene compound, monoacylphosphine oxide, bisacylphosphine oxide and a combination of bisacylphosphine oxide and α-hydroxyketone.

Among the photo-initiators (c), examples of a compound which is sensitized with light used for the pre-exposure and functions as a photocationic polymerization initiator are, for instance, iron-arene complex and the like. These photo-initiators (c) may be used alone or may be used in combination of two or more thereof. These are compounds having an absorption maximum wavelength mainly within a region from near ultraviolet light to visible light.

With respect to monoacylphosphine oxide, all of known monoacylphosphine oxides can be used. For example, there are monoacylphosphine oxide compounds described in JP60-8047B and JP63-4077B.

In the composition for the recording layer of the volume holographic data recording media of the present invention, the content of the photo-initiators (c) is preferably from 1 to 90% by weight (especially from 2 to 80% by weight). Depending on an exposure step for forming interference fringes, the photo-initiator (c) may comprise either a photoradical polymerization initiator (c-1) or a photocationic polymerization initiator (c-2), or a photo-initiator comprising the both may be used to function as an initiator for the post-exposure step to be carried out if necessary. Further, a compound functioning as both of the photoradical polymerization initiator (c-1) and the photocationic polymerization initiator (c-2) may be used as the photo-initiator (c). When different compounds are used as the photoradical polymerization initiator (c-1) and the photocationic polymerization initiator (c-2) together, it is preferable to use a photo-initiator comprising 5 to 70% by weight (especially 8 to 40% by weight) of the photoradical polymerization initiator (c-1) and 5 to 70% by weight (especially 8 to 40% by weight) of the photocationic polymerization initiator (c-2) based on the total amount of photo-initiators.

A dye sensitizer (e) is generally a component absorbing light, and for increasing sensitivity of the photo-initiator (c), a combination of the photo-initiator (c) and the dye sensitizer (e) is preferably used. A compound which does not substantially absorb light having a wavelength of light source used for the pre-exposure or undergoes less absorption of such light is used as the dye sensitizer (e). In many cases, colored compounds like a dye are used as the dye sensitizer (e) for absorption of visible laser beam.

The dye sensitizer (e) is one undergoing absorption of light of visible region, and in addition to those mentioned above, there can be used, for example, cyanine derivative, merocyanine derivative, phthalocyanine derivative, xanthine derivative, thioxanthene derivative, acridine derivative, porphyrin derivative, coumaran derivative, base styryl derivative, ketocumaran derivative, quinolone derivative, stilbene derivative, oxazine derivative and thiazine dye. Further, there can be used dye sensitizers described in "Dye Handbook" (edited by Shinya Ogahara, KODANSHA CO., LTD., 1986), "Chemistry of Functional Dyes" (Shinya Ogahara, C.M.C., 1983) and "Special Functional Materials" (edited by Chuzaburo Ikemori, C.M.C., 1986). When a colorless transparent volume hologram recording layer is finally required, it is preferable to use cyanine dyes described in JP58-29803A and JP1-287105A as the dye sensitizer. Since cyanine dyes are generally decomposed easily by light, the dye in the volume hologram is decomposed when subjected to the post-exposure in the present invention or left under room light or sun light for several hours to several days, resulting in no absorption of visible light, and thus a colorless transparent volume hologram can be obtained.

When a finally obtained volume hologram is not required to be colorless and transparent, it is possible to use gambir-catechu dyes described in JP6-184311A, JP6-317907A or JP2000-511302A and coumaran dyes described in JP63-180946A.

Examples of combinations of organic peroxides with dye sensitizers are preferably combinations of 3,3',4,4'-tetra(tert-butyl peroxycarbonyl)benzophenone, a mixture of "3,3-bis-methoxycarbonyl-4,4-bis-tert-butyl peroxycarbonyl benzophenone, 3,4-bismethoxycarbonyl-4,3-bis-tert-butyl peroxycarbonyl benzophenone and 4,4-bismethoxycarbonyl-3,3-bis-tert-butyl peroxycarbonyl benzophenone" or di-tert-butylperoxyisophthalate with a dye sensitizer available from Nippon Kanko Shikiso Kenkyuusho such as NKX653, NKX3883, NKX188150, NKX1253, NKX1595, NKX1658, NKX1695, NK4256, NK1886, NK1473, NK1474, NK4795, NK4276, NK4278, NK91, NK1046, NK1237, NK1420, NK1538 or NK3590.

Examples of combinations of 2,4,6-substituted-1,3,5-triadines with dye sensitizers are preferably combinations of 2,4,6-tris(trichloromethyl)-1,3,5-triadine, 2-phenyl-4,6-bis (trichloromethyl)-1,3,5-triadine or 2,4-bis(trichloromethyl)-6-(p-methoxy phenyl vinyl)-1,3,5-triadine with a dye sensitizer available from Nippon Kanko Shikiso Kenkyuusho such as NKX653, NKX3883, NKX188150, NKX1253, NKX1595, NKX1658, NKX1695, NK4256, NK1886, NK1473, NK1474, NK4795, NK4276, NK4278, NK91, NK1046, NK1237, NK1420, NK1538 or NK3590.

In addition, there can be suitably used a combination of "B-CIM" available from HODOGAYA CHEMICAL CO., LTD. as a bisimidazole derivative, a chain transfer agent such as 2-mercaptobenzoxazole or 2-mercaptobenzothiazole, and the above-mentioned dye sensitizers.

Examples of combinations of carbonyl compounds with dye sensitizers are benzyl/Michler's ketone, benzyl/Acridine Yellow, and the like. In addition, a dye sensitizer used in combination with an amine compound is preferably decarboxylated Rose Bengale. Examples of preferable dye sensitizer used in combination with borate compounds are cyanine dyes such as cyanines, isocyanines and pseudocyanines.

In the composition used for the recording layer of the volume holographic data recording media of the present invention, the content of dye sensitizer (e) is preferably 0.01 to 15% by weight (especially 0.03 to 10% by weight) from the viewpoint of recording sensitivity, dynamic range and shrinkage percentage.

Further, a photo-sensitizer may be used for the composition used on the recording layer of the volume hologram data recording media of the present invention. Examples of photo-sensitizers which are used suitably are Michler's ketone, Acridine Yellow, merocyanine, Methylene Blue, camphorquinone, Eosine, 2,5-bis[(4-diethylamino)-2-methyl-benzylidene]cyclopentanone, and decarboxylated Rose Bengale.

In addition, it is preferable to add additives, for example, a plasticizer, a thermal stabilizer, a brightening agent, an ultraviolet absorber, a polymerization inhibitor, a chain transfer agent, a bleaching agent, and if necessary, ultrafine particles, to the composition used for the recording layer of the volume holographic data recording media of the present invention.

Nonlimiting examples of ultrafine particles are, for instance, fine particles of inorganic compounds and colloid sol, and preferable are inorganic oxides having a refractive index of not more than 1.70.

Specifically desirable are ultrafine particles and colloid sol such as colloidal silica (refractive index: 1.45) and colloidal zirconia (refractive index: 1.55). It is desirable that a particle size (volume average particle size) of ultrafine particles and colloid sol is sufficiently small as compared with a wavelength of visible light in order to secure transparency of low refractive index material. The particle size is specifically not more than 100 nm, especially preferably not more than 10 nm.

The volume average particle size of fine particles is measured at room temperature with a particle size distribution measuring equipment (for example, 9320HRA available from MICRO TRACK CO., LTD.) using a laser diffraction scattering method by dispersing the fine particles in an organic solvent such as ethanol.

When using fine particles of an inorganic compound, it is desirable to use the fine particles in the form of organic sol by previously dispersing the fine particles in an organic dispersion medium in order not to lower dispersion stability in the composition and hologram recording stability in the material. Further, in order to improve dispersion stability of the fine particles of an inorganic compound in the composition, surfaces of the fine particles of an inorganic compound can be previously decorated with various coupling agents. Examples of coupling agents are, for instance, silicon compounds subjected to organic substitution; metal alkoxides such as aluminum, titanium, zirconium, antimony and mixtures thereof; salts of organic acids; coordination compounds bonded to coordination compound, and the like.

One of preferable embodiments of a preparation process of the volume holographic data recording media is a method of pouring the composition for the volume holographic data recording material of the present invention between transparent substrates. Specific examples of a method of pouring the composition between the transparent substrates are a method of arranging a pair of transparent substrates (first substrate and second substrate) so that the transparent substrates are positioned at both sides of the obtained recording layer and then pouring the fluorine-containing composition for the volume holographic data recording material between the two transparent substrates, a method of previously making a filling hole on a box type transparent substrate and pouring the fluorine-containing composition for the volume holographic data recording material through the filling hole, and a method of leaving one surface of a box type transparent substrate (first substrate) open and, after pouring or adding dropwise the fluorine-containing composition for the volume holographic data recording material therein, covering a transparent substrate (second substrate) over the open surface.

There are two embodiments of the volume holographic data recording media of the present invention, namely, one is an embodiment (for example, cf. FIGS. 1 to 3) having a servo pit pattern for positioning (addressing) for recording or read-out, and another one is an embodiment (for example, cf. FIG. 6) having no servo pit pattern.

The volume holographic data recording media having a servo pit pattern has a reflecting layer and a recording layer on a substrate, and the servo pit pattern is formed on the reflecting layer. A pit length is less than 2 μm.

Then an optical disc which is an example of the volume holographic data recording media of the present invention is explained below by means of drawings.

Figure 2:
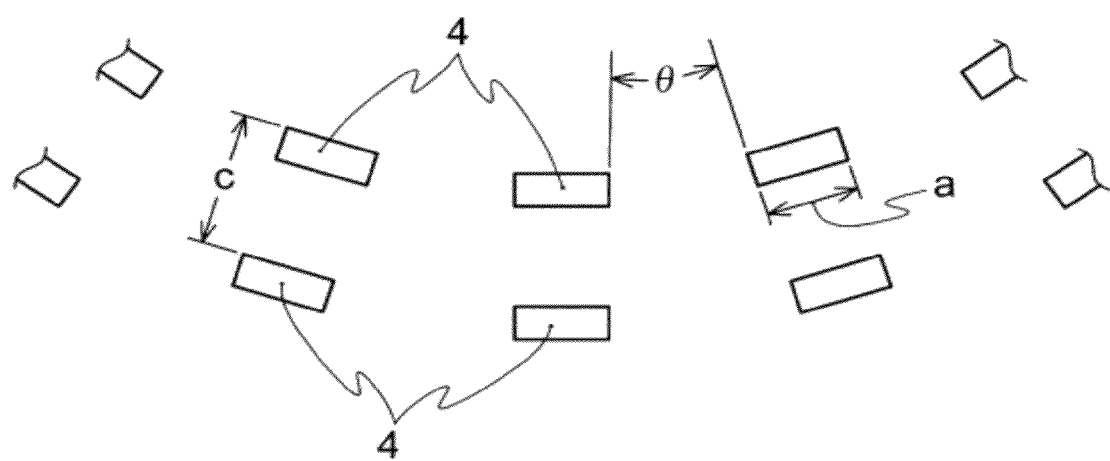
FIG. 2 is a partly enlarged view of a plan view of the optical disc according to the embodiment of the present invention.

FIG. 1 is a plan view of an optical disc 1, and FIG. 2 is a partly enlarged view Z of the plan view of the optical disc 1 of FIG. 1. The optical disc 1 has a center hole 2, and a continuous spiral track 3 is formed from its inner circumference toward its outer circumference. The track 3 may be in the form of concentric circle. On the track 3 are formed pits 4 (FIG. 2). The pits 4 are previously recorded during production of the optical disc 1.

A track pitch of the servo pit pattern (a distance between the pits in its radius direction, namely, (c) in FIG. 2) is not limited specifically and can be optionally selected depending on purpose. The track pitch is preferably not more than 10 μm. When the track pitch exceeds 10 μm, there is a case where recording density is decreased. When the track pitch is less than a preferable lower limit of each wavelength, in some cases, tracking becomes unstable due to light scattering while light is passing through the recording layer, and when the track pitch exceeds a preferable upper limit, there is a case where recording density is decreased.

In the present invention, the pit length is a length shown by a in FIG. 2. The pit length is less than 2 μm from the viewpoint of improvement of recording density. Further, the pit length is preferably not less than 0.1 μm, more preferably not less than 0.3 μm from the viewpoint of detection of a servo signal.

The pits 4 are provided at a given angle θ (usually 0.5 to 5 degrees), and a shape thereof is rectangular.

Figure 3:
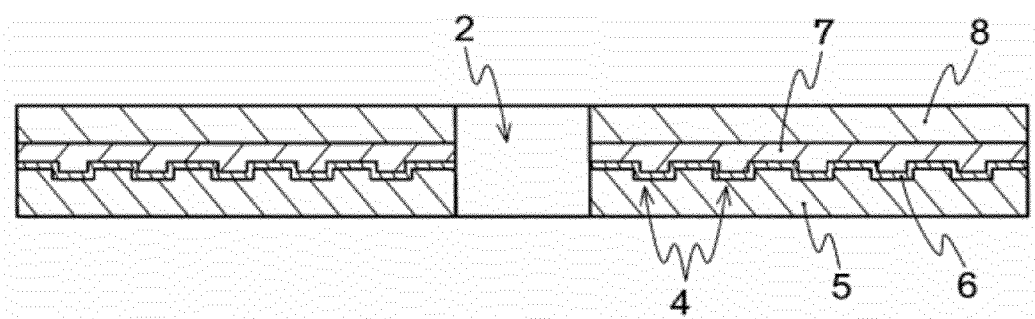
FIG. 3 is a cross-sectional view diagrammatically showing the optical disc according to the embodiment of the present invention.

FIG. 3 is a cross-sectional view diagrammatically showing the optical disc of FIG. 1. On the optical disc 1 is recorded digital data by holography. The optical disc 1 is in the form of disc, and a center hole 2 is formed at its center for fixing a spindle of a device for recording and read-out of the optical data. The optical disc is formed by laminating the first substrate 5, the reflecting layer 6, the recording layer 7 and the second substrate 8.

The thickness of the first substrate 5 and the second substrate 8 is, for example, from 5 to 1,200 μm. The material of the first substrate 5 and the second substrate 8 is a plastic such as polycarbonate or transparent glass or quartz. In recording and reading out the data, since laser beam is emitted on the optical disc 1 from the side of the second substrate 8, a material of the second substrate 8 must be one transmitting laser beam having a given wavelength, but a material of the first substrate 5 is not limited to such a material. However, when laser beam is emitted on the optical disc 1 from the both sides of the first substrate 5 and the second substrate 8, the first substrate 5 must have property of transmitting laser beam substantially. The first substrate 5 and the second substrate 8 may be in the form of plate, film or transparent coated film.

On the surface of the first substrate 5 are formed pits 4.

The thickness of the recording layer 7 is, for example, from 188 to 1,500 μm. The material of the recording layer 7 is a radically polymerizable hologram recording material. The hologram recording material is one in which when laser beam such as signal light and reference light are emitted on the recording layer 7 for a given period of time, optical characteristics (refractive index, absorptivity, transmission, fluorescence emitting property and reflection) of the emitted portion change according to intensity of the laser beam. The hologram recording material comprises a photosensitive material. The material of the recording layer 7 is, for example, a composition for a volume holographic data recording material which is sensitized by laser beam and polymerized. Example thereof is the above-mentioned fluorine-containing material, especially the composition comprising the base polymer (a), the liquid monomer (b) and the photo-initiator (c).

The reflecting layer 6 is provided on the first substrate 5 so as to cover the pits 4. The reflecting layer 6 is made of metal having property of reflecting laser beam, specifically aluminum, silver, gold or silicon. The thickness of the reflecting layer 6 is, for example, from 30 to 1,000 nm.

In the optical disc of FIG. 3, an oxygen barrier layer may be provided between the reflecting layer 6 and the recording layer 7, and also an oxygen barrier layer may be provided between the recording layer 7 and the second substrate 8. Further, spacers may be provided at an inner circumference and an outer circumference of the first substrate 5.

Figure 4:
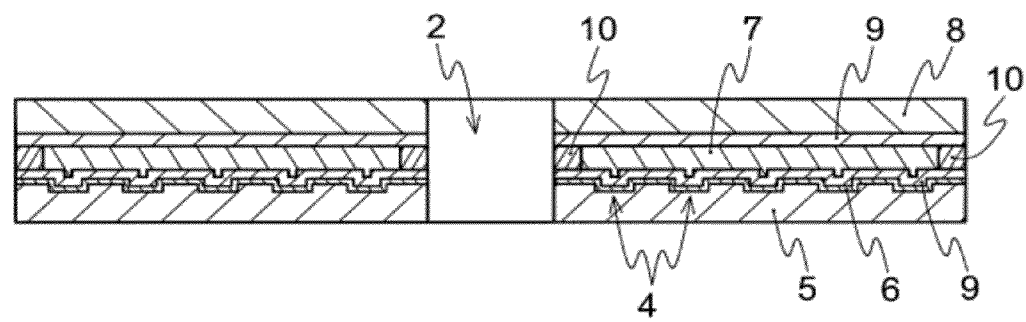
FIG. 4 is a cross-sectional view diagrammatically illustrating the optical disc according to the first embodiment of the present invention.

FIG. 4 is a cross-sectional view diagrammatically illustrating the optical disc of the first embodiment with respect to the optical disc diagrammatically illustrated in the cross-sectional view of FIG. 1. In the cross-sectional view of FIG. 4, the optical disc 1 is in the form of disc, and a center hole 2 is formed at its center for fixing a spindle of a device for recording and read-out of the optical disc. The optical disc 1 is formed by laminating the first substrate 5, the reflecting layer 6, the oxygen barrier layer 9, the recording layer 7, the oxygen barrier layer 9 and the second substrate 8, and spacers 10 are provided at an inner circumference and an outer circumference of the first substrate 5.

The oxygen barrier layers 9 (an example of a pair of oxygen barrier layers) are provided on and under the recording layer 7 so as to sandwich the recording layer 7 between them. Since the recording layer 7 is covered with the oxygen barrier layers 9, oxygen hardly invades into the recording layer 7 from the outside of the optical disc 1. The material of the oxygen barrier layers 9 is an ethylene-vinyl alcohol copolymer, and the thickness thereof is, for example, from 20 to 100 μm. The ethylene-vinyl alcohol copolymer is transparent, and therefore, laser beam can pass through it.

At an inner circumference and an outer circumference of the first substrate 5 are provided the respective ring spacers 10 between the oxygen barrier layers 9. A material of the spacers 10 is, for example, stainless steel or ceramic, and by use of them, oxygen is prevented from invading into the recording layer 7 from the side surface of the optical disc 1. The thickness of the spacers 10 is equal to the thickness of the recording layer 7.

The second substrate 8 is provided on the recording layer 7 via the oxygen barrier layer 9, and the recording layer 7 is supported by the second substrate 8 and the first substrate 5. The recording layer 7 may be supported by either the first substrate 5 or the second substrate 8.

In the first embodiment, the thickness of the optical data recording layer formed by using the fluorine-containing composition for the volume holographic data recording material is preferably from 188 to 1,500 μm, more preferably from 200 to 1,000 μm, from the viewpoint of multiplexed hologram storage capacity and dynamic range M/#.

The substrates for the volume holographic data recording media are those having transparency, and examples of material thereof are glass, quartz and resins such as polycarbonate, polyethylene, polypropylene, amorphous polyolefin, polyethylene fluoride, polyvinylidene fluoride, polyvinyl chloride, polyvinylidene chloride, ethylene-vinyl alcohol copolymer, polyvinyl alcohol, polymethyl methacrylate, polyether sulfone, polyether ether ketone, polyamide, tetrafluoroethylene-perfluoro(alkyl vinyl ether) copolymer, polyester such as polyethylene terephthalate and polyimide.

There are used, as light source for recording of holograms, visible laser beams, for example, laser beams from AlGaN or InGaN (wavelength: 405±5 nm) single mode laser comprising bluish purple LD having a center wavelength of 407 nm and equipped with an outer resonator, frequency-tripled Nd:YAG lasers (wavelength: 355 nm), He—Cd (wavelength: 442 nm), argon ion laser (458 nm, 488 nm, 515 nm), YAG or Nd:YVO4 laser (532 nm), and hologram data is recorded in the data recording layer by usual process. This light source has the coherent length of as long as 10 m or more (at single mode) and is very stable. In order to mainly measure a servo (addressing) of a material in a hologram forming process during the recording, He—Ne laser (wavelength: 633 nm) is used as light source which does not sensitize the recording material.

Figure 5:
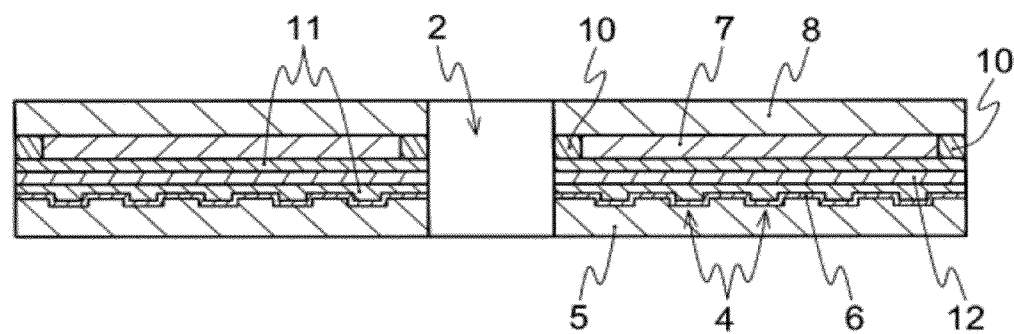
FIG. 5 is a cross-sectional view diagrammatically illustrating the optical disc according to the second embodiment of the present invention.

FIG. 5 is a cross-sectional view diagrammatically illustrating the optical disc of the second embodiment with respect to the optical disc diagrammatically illustrated in the cross-sectional view of FIG. 1. In FIG. 5, the optical disc 1 is formed by laminating the first substrate 5, the reflecting layer 6, a gap layer 11, a wavelength selecting layer 12, a gap layer 11, the recording layer 7 and the second substrate 8, and spacers 10 are provided at an inner circumference and an outer circumference of the first substrate 5.

The optical disc is in the form of disc, and a center hole 2 is formed at its center for fixing a spindle of a device for recording and read-out of the optical disc. On the surface of the first substrate 5 are formed pits 4.

The gap layers 11 are provided on and under the wavelength selecting layer 12 so as to sandwich the wavelength selecting layer 12 between them, and examples of material of the gap layers 11 are glass, quartz and resins such as polycarbonate, polyethylene, polypropylene, amorphous polyolefin, polyethylene fluoride, polyvinylidene fluoride, polyvinyl chloride, polyvinylidene chloride, ethylene-vinyl alcohol copolymer, polyvinyl alcohol, polymethyl methacrylate, polyether sulfone, polyether ether ketone, polyamide, tetrafluoroethylene-perfluoro(alkyl vinyl ether) copolymer, polyester such as polyethylene terephthalate and polyimide, and non-fluorine-containing hard coating agents. The wavelength selecting layer 12 can be formed on the transparent supporting substrate by film formation using a plurality of film forming materials by electron beam evaporation (EB evaporation), sputtering or the like. The above-mentioned thin films may be organic multilayer films having different refractive indexes, organic multilayer films comprising inorganic substance, or inorganic multilayer films, and example of inorganic multilayer films is a dichroic mirror layer. In this case, those films can be formed at lower cost by coating, laminating or the like. Examples of dichroic mirror layer are multilayer films comprising $TiO_2/SiO_2$, for example, multilayer films of 29-layer structure comprising $TiO_2/SiO_2$—$SiO_2/TiO_2$, and it is preferable to optionally select the dichroic mirror layer depending on a wavelength of light to be used.

For visible light and infrared light, for example, there are preferably exemplified:

$TiO_2$, $CeO_2$, $Ta_2O_5$, $ZrO_2$, $Sb_2O_3$, $HfO_2$, $La_2O_3$, $NdO_3$, $Y_2O_3$, $ZnO$ and $Nb_2O_5$ as materials having a high refractive index (materials having a refractive index of about not less than 1.8)

$MgO$, $Al_2O_3$, $CeF_3$, $LaF_3$ and $NdF_3$ as materials having a relatively high refractive index (materials having a refractive index of about 1.6 to 1.8), and $SiO_2$, $AlF_3$, $MgF_2$, $Na_3AlF_6$, $NaF$, $LiF$, $CaF_2$ and $BaF_2$ as materials having a low refractive index (materials having a refractive index of about not more than 1.5).

For ultraviolet light, there are exemplified:

$ZrO_2$, $HfO_2$, $La_2O_3$, $NdO_3$, $Y_2O_3$, $TiO_2$, $Ta_2O_5$ and $ZrO_2$ as materials having a high refractive index (materials having a refractive index of about not less than 1.8) (however, a wavelength of light is about 360 nm to about 400 nm)

$MgO$, $Al_2O_3$, $LaF_3$ and $NdF_3$ as materials having a relatively high refractive index (materials having a refractive index of about 1.6 to 1.8), and $SiO_2$, $AlF_3$, $MgF_2$, $Na_3AlF_6$, $NaF$, $LiF$ and $CaF_2$ as materials having a low refractive index (materials having a refractive index of about not more than 1.5).

In addition, the wavelength selecting layer 12 may be one having a coloring agent-containing layer comprising at least either a pigment or a dye. Further, the wavelength selecting layer 12 may be a laminated article made by laminating two or more cholesteric liquid crystal layers. The wavelength selecting layer 12 may comprise a photosensitive chiral compound, the photosensitive chiral compound may have a chiral structure and a photosensitive group, and the chiral structure may be one selected from an isosorbide compound, an isomannide compound and a bi-naphthol compound. The coloring agent-containing layer, the cholesteric liquid crystal layers and the wavelength selecting layer 12 are not specifically limited, and can be optionally selected depending on purposes. For example, the wavelength selecting layer 12 is formed by using a laminated article comprising a dielectric deposition layer, a single layer or two or more layers of cholesteric liquid crystal layers, and further, other layer if necessary. The wavelength selecting layer 12 may have a layer comprising a coloring agent. The dielectric deposition layer is made by laminating a plurality of dielectric thin film layers having different refractive indexes, and in order to make a wavelength selecting layer, it is preferable to laminate plural layers comprising dielectric thin films having a high refractive index and dielectric thin films having a low refractive index alternately. The thin films are not limited to two kinds of films, and more than two kinds of films may be used. In addition, when a layer comprising a coloring agent is provided, it is desirable to form the layer under the dielectric deposition layer.

Corrosion and deterioration of the second substrate 8 by the recording layer 7 can be prevented by surface coating of a material for the gap layer 11 on the side of the second substrate 8 or providing a film formed using the same material on an interface between the second substrate 8 and the recording layer 7.

The thickness of the first substrate 5 of the optical disc in FIG. 5 is, for example, from 1,100 to 1,200 μm. For the first substrate 5, the second substrate 8 and the reflecting layer 6, the same materials and shapes as those mentioned in the first embodiment can be used.

The thickness of the recording layer 7 of the optical disc in FIG. 5 is, for example, from 400 to 1,500 μm. For the recording layer 7, the same materials as those mentioned in the first embodiment can be used.

The thickness of the whole optical disc in FIG. 5 is, for example, from 2,300 to 3,500 μm.

In the optical disc of FIG. 5, oxygen barrier layers may be arranged on and under the recording layer 7 so as to sandwich the recording layer 7 between them. With respect to the oxygen barrier layers, the same layers as explained in the first embodiment can be used.

Figure 6:
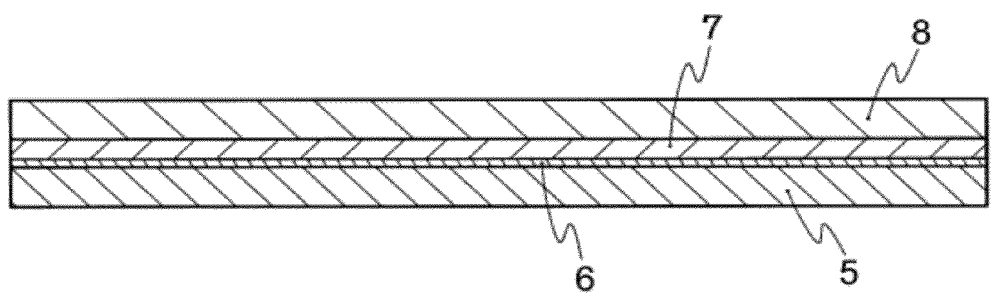
FIG. 6 is a diagrammatic cross-sectional view showing a data recording medium in the form of card according to the embodiment of the present invention.

In FIG. 3, when the data recording medium is not an optical disc but a card, servo pit pattern may not be provided. FIG. 6 is a diagrammatic cross-sectional view showing a data recording medium in the form of card. In addition, in FIG. 6, a gap layer may be provided between the reflecting layer and the recording layer.

As mentioned above, the optical disc having a layer structure shown in FIG. 5 is suitable for focusing, tracking and addressing.

The optical discs and card shown in FIG. 1, FIGS. 3 to 6 can be formed into cartridge by packaging them with a case for shielding them from outside light.

Examples of uses and applications of the volume holographic data recording material other than volume holographic data recording media are optical element, impartation of property for improving display or decoration pattern, interference measurement, optical data processing and optical data recording.

Examples of optical element are diffraction grating, scanner for POS, optical head for CD•DVD player, beam splitter, interference filter, head-up display for plane and automobile, optical switching, waveguide, and the like.

Examples of impartation of property for improving display or decoration pattern are three-dimensional display, hologram art, interior and exterior decoration, recording of artistic handicrafts, educational materials, cover and illustration of book and magazine, decoration and prevention of forgery of securities, ID card, credit card, cash card and telephone card, stereoscopic vision of CT image, and the like.

Examples of interference measurement are measurement of displacement and deformation of an object, measurement of vibration of an object, measurement of accuracy of optical display (computer-generated holography) and the like.

Examples of optical data processing are pattern recognition and verification of fingerprints using holographic matched filter.

Examples of optical data recording are (high grade or digital) television broadcasting, image recording of video camera and monitoring camera, data retrieval recording, figures and letters input device, holographic associative memory, and the like.

EXAMPLES

The present invention is then explained by means of Examples, but is not limited to them.

Examples 1 to 6

(1) Preparation of Composition for Volume Holographic Data Recording Material

To 2 g of a fluorine-containing polymer (a number average molecular weight measured by GPC analysis using tetrahydrofuran (THF) as a solvent was 70,000, a weight average molecular weight was 150,000, and a fluorine content was 60.1%) having hydroxyl at an end of its side chain and comprising, as a base polymer, only a homopolymer comprising perfluoro-(1,1,9,9-tetrahydro-2,5-bistrifluoromethyl-3,6-dioxanonenol) as a structural unit were added 2 g of ethylene oxide bisphenol A diacrylate, 1 g of acryloyl morpholine and 2 g of propoxylated ethoxylated dimethacrylate as liquid monomers, 0.1405 g of 2,4,6-tris(t-trichloromethyl)-s-triazine as a photo-initiator, and 0.00441 g of 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8ij]quinolizine-11-on as a dye sensitizer. Thus a homogeneous composition for volume holographic data recording material was prepared.

(2) Preparation of Volume Holographic Data Recording Media

The composition for volume holographic data recording material prepared in (1) above was put between 1.2 mm thick glass substrates (30×30 mm square) (SHOT B270 available from Tokiwa Optical Corporation) subjected to antireflection treatment ($SiO_2$ multilayer film) against 532 nm light, and PET spacers of 188 μm (Example 1), 400 μm (Example 2) and 600 μm (Example 3) were sandwiched between the glass substrates to keep the thickness.

(Film Thickness)

The thickness of the fluorine-containing volume holographic data recording media depends on the thickness of the PET film spacer to be sandwiched together with the composition for the recording material, and therefore, is determined according to the thickness of the PET film spacer.

(Recording and Reading Out of Single Hologram)

Figure 8:
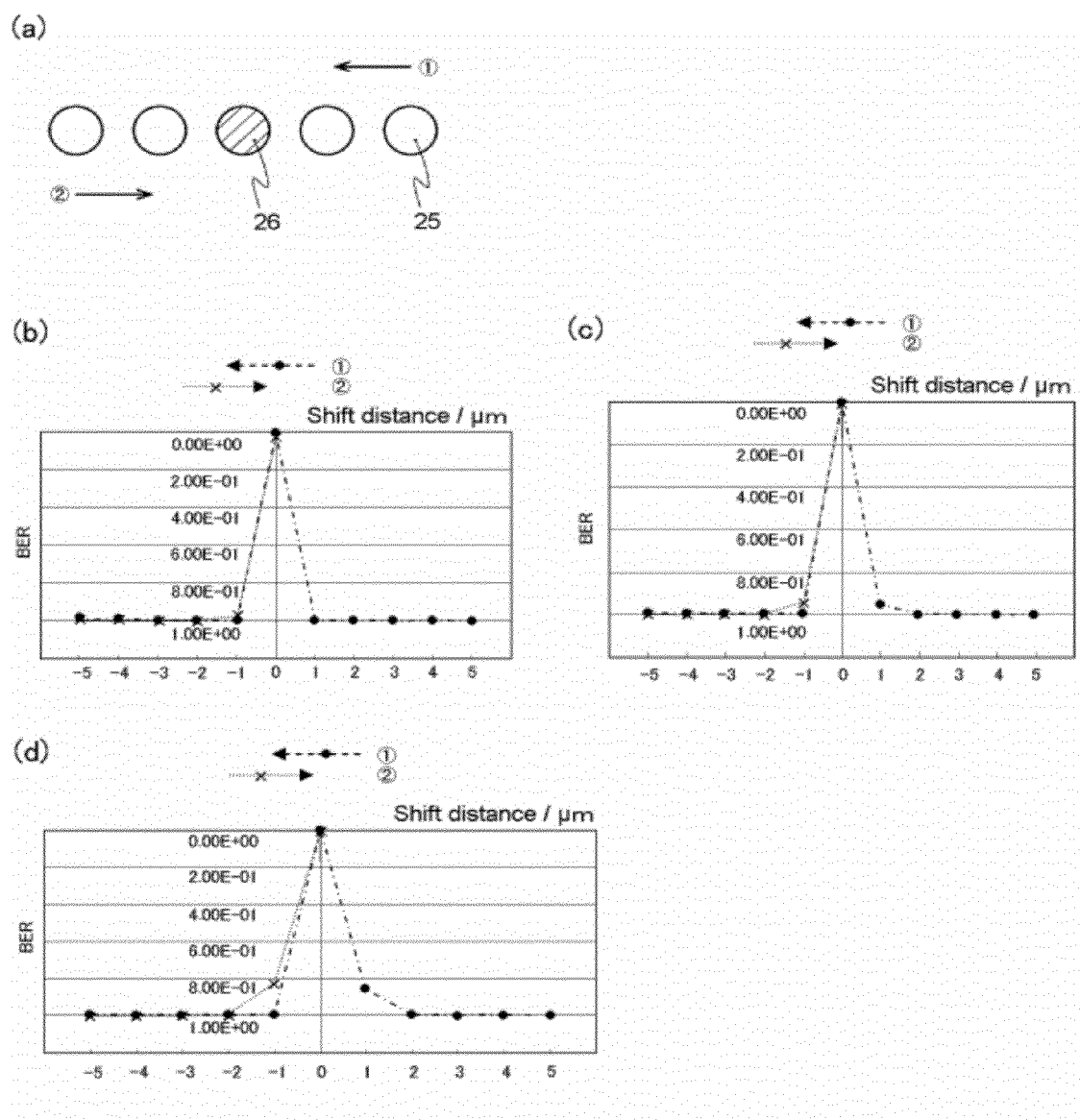
FIG. 8($a$) diagrammatically shows a method of measuring single hologram, and FIG. 8($b$) to FIG. 8($d$) are graphs showing a relation between the BER value and the shift distance in Examples 1 to 3, respectively.

Recording and reading out of single hologram were carried out using the above-mentioned volume holographic data recording media (film thickness: 188 µm (Example 1), 400 µm (Example 2) and 600 µm (Example 3). FIG. 8(a) shows a method of measuring single hologram, and FIG. 8(b) to FIG. 8(d) are graphs showing a relation between the BER value and the shift distance in Examples 1 to 3. In FIG. 8(a) and FIGS. 8(b) to 8(c), ① represents a read-out direction of single hologram from +5 µm, and ② represents a read-out direction of single hologram from −5 µm.

As shown in FIG. 8(a), only reading out is conducted by shifting in the direction of ① from a spot +5 µm apart from a recorded and reconstructed hologram 26 (center spot (slashed circle)), and both of recording and reading out are carried out at the center spot (slashed circle), followed by further shifting. Further, shifting is carried out in the direction of ② from a spot −5 µm apart from the center spot up to the center spot, and only recording is carried out at the center spot (slashed circle).

Namely, recording is carried out only at the center spot (slashed circle), and reading out of a reconstructed hologram 25 is carried out from the spot +5 µm apart from the center spot to the spot −5 µm apart from the center spot and then back to the spot +5 µm apart from the center spot. Thus whether or not a hologram image can be read out clearly with less noise at the center spot (slashed circle) is investigated.

As a result, the behavior of BER value changed from 0E+00 to 1.00E+00. The same behavior of BER value appeared on all of the recording materials having thicknesses used, and it is presumed that this is attributable to a low refractive index of the recording material.

(3) Recording of Hologram Digital Data on the Fluorine-Containing Volume Holographic Data Recording Media A fluorine-containing volume holographic data recording media was prepared by sandwiching the composition for volume holographic data recording material prepared in (1) above between 0.5 mm thick glass substrate (50×50 mm square, diameter: 120 mm, inner diameter: 15 mm) subjected to aluminum deposition treatment and a 0.5 mm thick glass substrate subjected to antireflection treatment as a cover glass by using PET spacers of 188 µm (Example 4), 400 µm (Example 5) and 600 µm (Example 6). The respective hologram digital data (page data) was recorded at 25° C., while changing an amount of pulse of the recording so that diffraction efficiencies would be a given value, with a collinear holographic material test system [SHOT-1000G S-VRD: fixed sample stage 23 in FIG. 7/Optical Disc Drive System: turned sample stage 23 in FIG. 7 (available from PULSTEC INDUSTRIAL CO., Ltd./Toyohashi University of Technology)] equipped with a pulse laser (10 ns with a wavelength of 532 nm). Then a page data was recorded, and recording density, an amount of spatial shift distance, SNR and BER were measured. The recording conditions are as mentioned below. Holograms were recorded and read out using shift distances of 0.1 µm, 1 µm and 3 µm.

Figure 9:
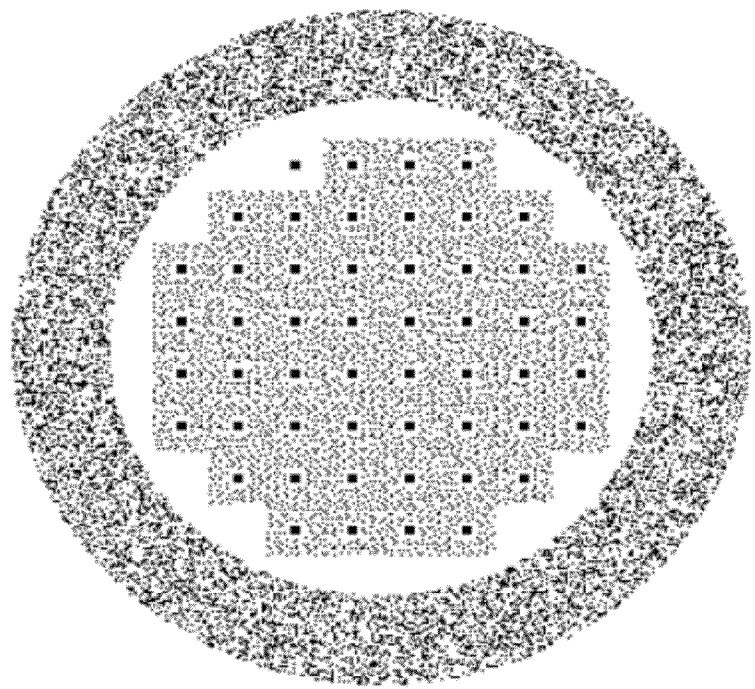
FIG. 9 is the hologram pattern when recording hologram digital data in Example 4.

The spatial light modulator used is one having a hologram pattern shown in FIG. 9 (1,024×768 pixels).

In several seconds to several tens minutes after the above-mentioned operation, interference pattern could be recorded by photo-polymerization with good repeatability. When this medium for recording is used, developing and fixing operations are not required, and generated holograms are stably maintained. This recording medium had the same performance even after being left for one week at room temperature (25° C.). The recording of the holograms could be easily fixed by overall exposure with natural light, UV light or LED light (532 nm) and maintained stably. There is no problem with use of these light sources.

Figure 7:
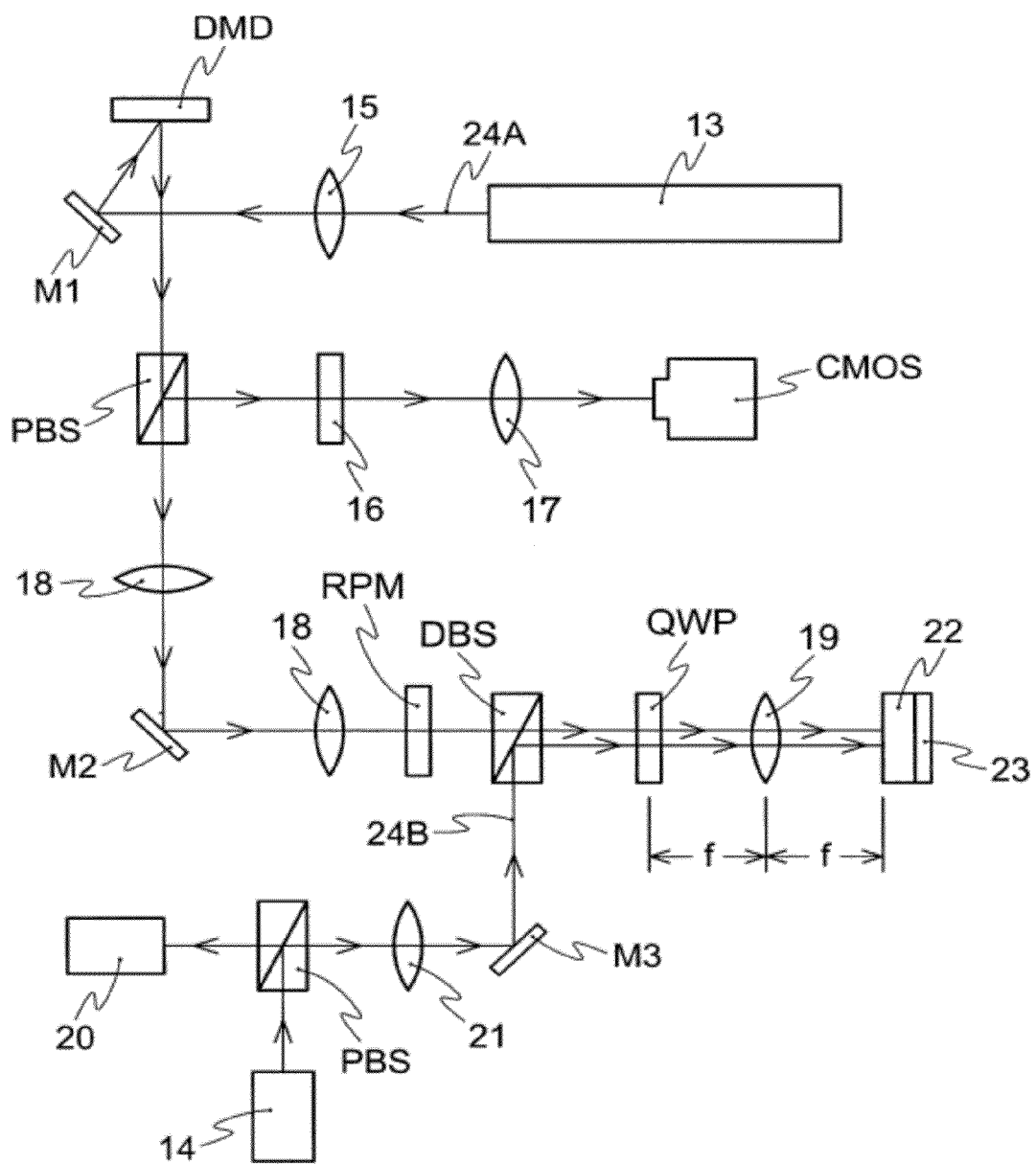
FIG. 7 is a diagrammatic view for explaining an optical system for preparing the volume holographic data recording media of Example.

In the collinear holographic material test system shown in the diagrammatic view of FIG. 7, numeral 13 is laser light source (Nd:YV04 pulse laser), numeral 14 is laser light source (red semiconductor laser), numeral 15 is a beam expander, numeral 16 is an aperture, numeral 17 is a zoom lens, numeral 18 is a relay lens, numeral 19 is an objective lens, numeral 20 is a detector, numeral 21 is a condensing lens, numeral 22 is a sample, numeral 23 is a sample stage, numerals 24A and 24B are laser beams, PBS is a polarized beam splitter, DMD is a spatial light modulator, DBS is a diffractive beam splitter, RPM is a random binary phase mask, M1 to M3 are mirrors, CMOS is a photodetector, QWP is a ¼ wavelength plate, and f is a focal distance.

The purpose of a random binary phase mask is to homogenize the spectrum and to suppress DC components on the Fourier plane (medium surface) for an effective consumption of the dynamic range of a medium. This technique was employed to make a holographic storage channel linear.

(Recording Conditions)

Light source Nd:YV04 for recording and reading out: Pulse laser (10 ns, 532 nm)

Focus servo light source: He—Ne CW laser (650 nm)

Spatial light modulating element: DMD

Detector: High performance CMOS sensor

Page data: Area of 1,024×768 pixels (1.6 KB/page data)

The results are shown in Table 1. In addition, FIG. 10 shows the volume holographic data recording medium subjected to recording of hologram digital data.

(Reconstructed Image of Single Hologram Obtained from Collinear Holographic Material Test System and Shift Selectivity)

Figure 10:
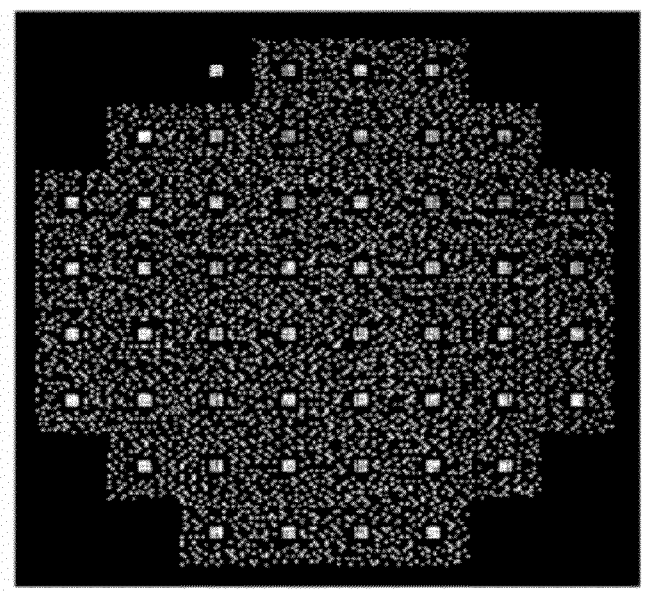
FIG. 10 shows the volume holographic data recording medium subjected to recording of hologram digital data in Example 4.

Reconstructed single hologram image is shown in FIG. 10. In that case, a Bit error Rate (BER) was $7.65 \times 10^{-5}$, an error count was 2, and a SN ratio (SNR) was 6.286.

(Shift Selectivity at Multiplex Hologram Recording)

Figure 11:
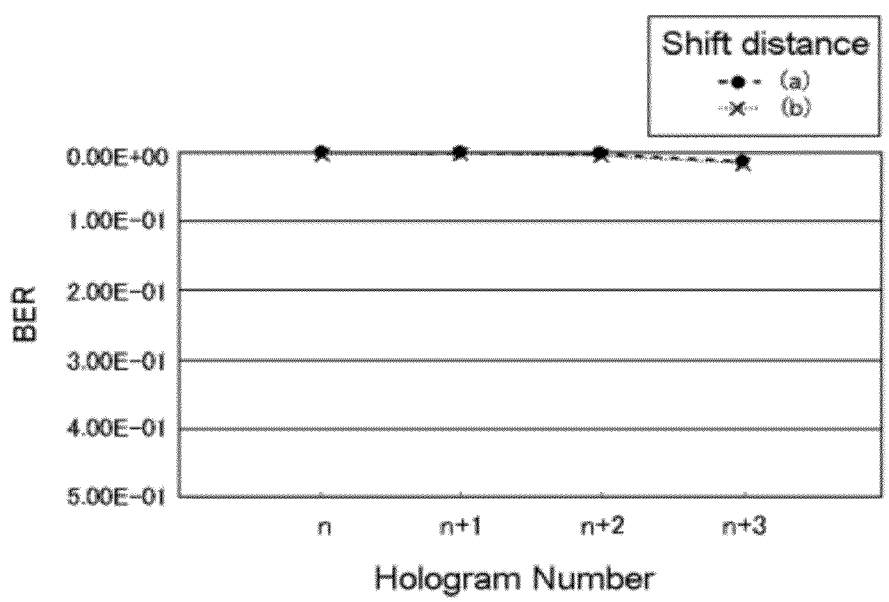
FIG. 11 shows the BER value at multiplex hologram recording (tetraplex) by shift selection of (a) 1 μm and (b) 3 μm in Example 6.

FIG. 11 shows a BER value at the multiplex recording (tetraplex) by shift selection of (a) 1 µm and (b) 3 µm in Example 6. From the results shown therein, there is no change in BER value at the shift distance of 1 µm and 3 µm, and it can be considered that high density holographic storage can be carried out.

Figure 12:
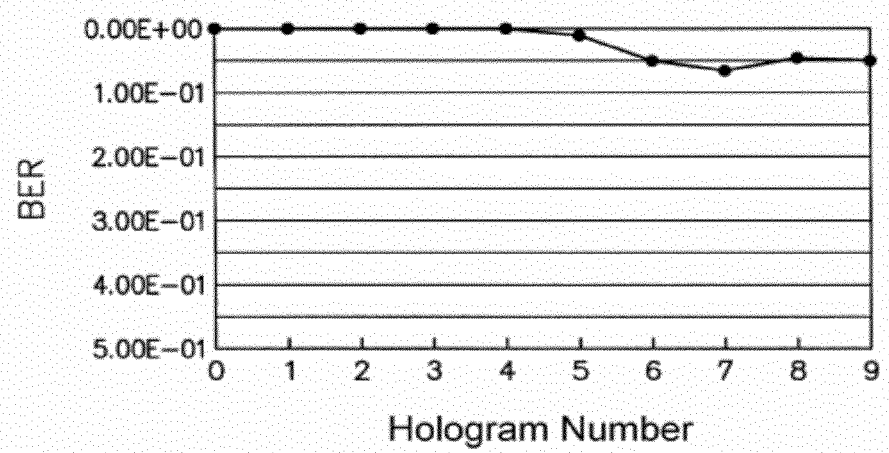
FIG. 12($a$) is a graph showing a BER value at multiplex holograms recording (in the form of cross) by shift selection of 1 μm in Example 5, and FIGS. 12($b$) and 12($c$) diagrammatically show recording of single page area in the form of cross.
Figure 12:
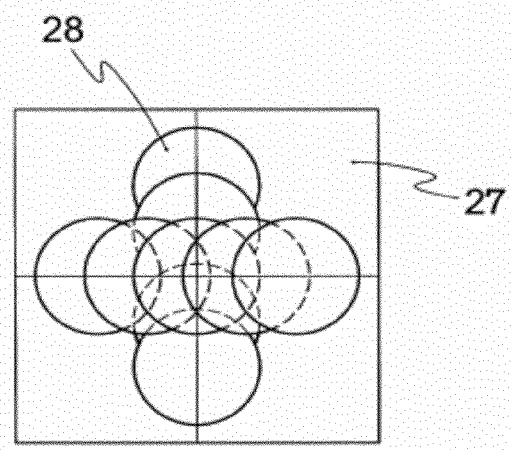
Figure 12:
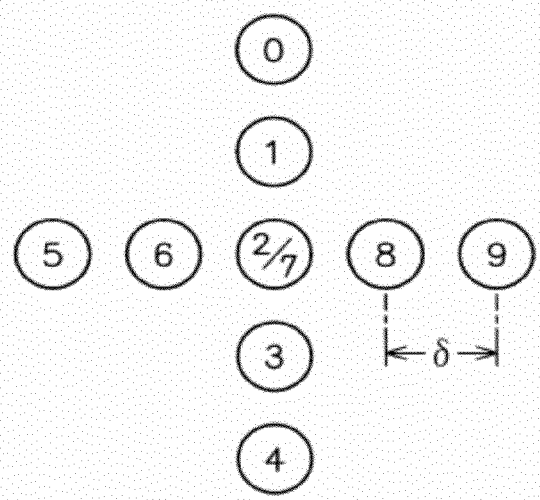

FIG. 12 shows a BER value when multiplex holograms were recorded (in the form of cross) by shift selection of 1 µm at the same spacer thickness as in Example 5. The results indicate that at a shift distance of 1 µm, BER values of each hologram do not change, and it can be considered that high density recording can be carried out.

(Reconstructed Single Hologram Image Obtained from Optical Disc Drive System and Error Rate)

Figure 13:
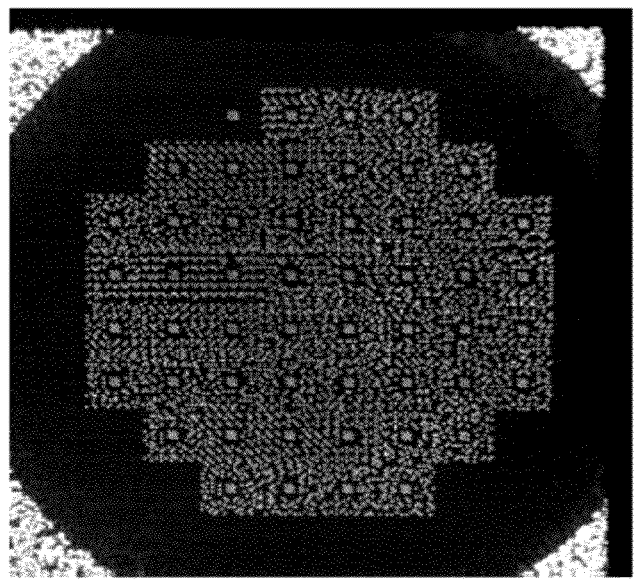
FIG. 13 shows a reconstructed single hologram image by digital data recording in Example 5.

Reconstructed single hologram image of Example 5 is shown in FIG. 13. The recording power was 0.4 µJ/pulse. In that case, the bit error rate (BER) was 0. Measurement was made using the page data having an area of 1,024×768 pixels (1.6 KB/page data).

Figure 14:
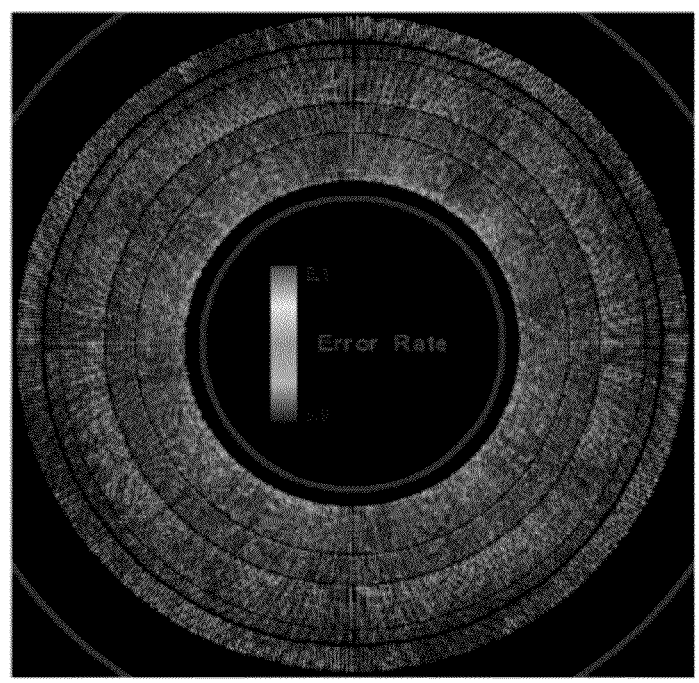
FIG. 14 shows the whole map of recording and reading out of single holograms when the holograms are recorded on the whole disc of 120 mm diameter in Example 5.

FIG. 14 shows the whole map of recording and reading out of single holograms when the holograms are recorded on the whole disc of 120 mm diameter in Example 5.

Conditions for recording and reading out are as follows.

Recording track: Totally 100 lines, every 200 tracks between track address 400 and track address 20,200

Recorded on: Frames 0, 157, 314 and 471 of the whole sector (recording of 480 pages in 1 track)

Recording power: HWP 50,000×2 (0.141 mJ/cm$^2$)

Read-out power: HWP 33,300
Track pitch length: 1.6 μm

In this case, an average error rate was 1.61%. Usually when the error rate is not more than 5%, recording and reading out of the disk can be carried out.

Further, recording and reading out of animation image using this disc was carried out.

Conditions for recording and reading out of animation image are as follows.

Recording track: 2,000, 2,200
Recorded on: Frames 0, 78, 156, 234, 312, 390, 468 and 546 of the whole sector (recording of 960 pages in 1 track)
Recording power: HWP 44,000×3
Read-out power: HWP 33,300
Recording and read-out file
  File capacity: 1.7 MB
  File mode: MOV
File for recording and reading out (error correction code)
  File capacity: 2.23 MB
  Number of recorded pages: 1,920

As a result of the recording and reading out of animation image, no difference in image quality was found between the original recorded image file and the reconstructed image file.

dimethacrylate was used as a liquid monomer instead of ethylene oxide bisphenol A dimethacrylate and propoxylated ethoxylated dimethacrylate.

Comparative Example 1

A composition for a fluorine-containing volume holographic data recording material was prepared in the same manner as in Example 1 except that polystyrene (having a weight average molecular weight of 230,000 measured by GPC analysis using tetrahydrofuran (THF) as a solvent) was used instead of the base polymer prepared in Example 1 and 2.5 g of diethyl sebacate was used as a plasticizer.

Comparative Example 2

Hologram recording was carried out in the same manner as in Example 2 except that the fluorine-containing volume holographic data recording medium was changed to a reference medium (Aprilis: Product No. HMC-050-G-12-D-400), for the purpose of comparison. The results are shown in Table 1.

TABLE 1

|  | Ex. 4 | Ex. 5 | Ex. 6 | Ex. 7 | Com. Ex. 1 | Com. Ex. 2 |
|---|---|---|---|---|---|---|
| Substrate | Glass | Glass | Glass | Glass | Glass | Glass |
| Base polymer (a) |  |  |  |  |  |  |
| Kind of cure site | Hydroxyl | Hydroxyl | Hydroxyl | Hydroxyl | — | — |
| Fluorine content (%) | 60.1 | 60.1 | 60.1 | 60.1 | 0 | 0 |
| Film thickness (μm) | 188 | 400 | 600 | 188 | 188 | 400 |
| Recording sensitivity (mJ/cm$^2$) | 0.00125 | — | — | — | — | 1.4 |
| Amount of spatial shift distance | 0.1 | 0.7 | 0.9 | — | — | 3 |
| SNR | 6.286 | 6.286 | 7.187 | — | — | — |
| BER | $7.65 \times 10^{-5}$ | $7.93 \times 10^{-5}$ | $7.53 \times 10^{-5}$ | — | — | $3.90 \times 10^{-3}$ |
| Recording of disc |  |  |  |  |  |  |
| Recording power | — | 1 pulse | — | — | — | — |
| BER | — | 0 | — | — | — | — |

Figure 15:
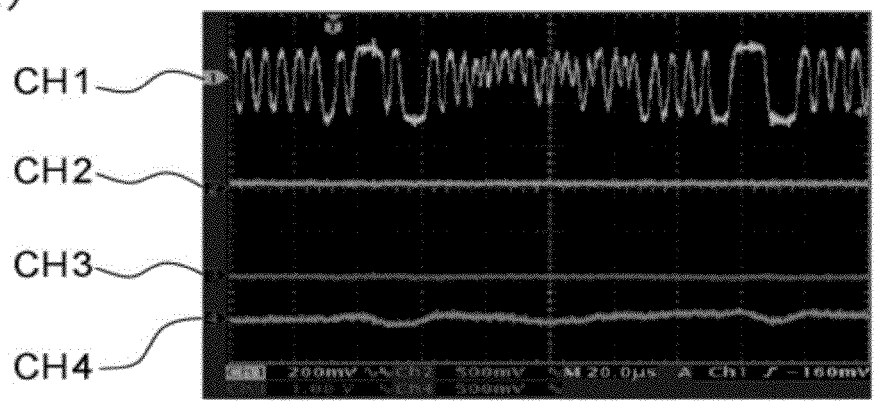
FIGS. 15(a), 15(b) and 15(c) show the results of disk servo evaluation of an inner circumference of the disk, an intermediate circumference of the disk and an outer circumference of the disk.
Figure 15:
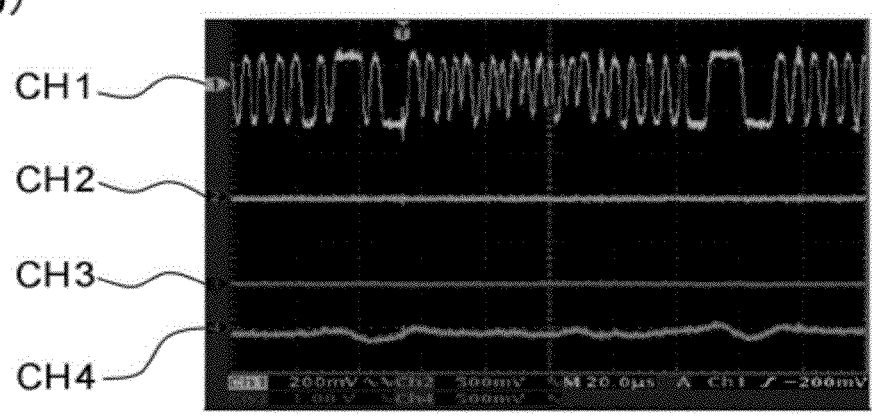
Figure 15:
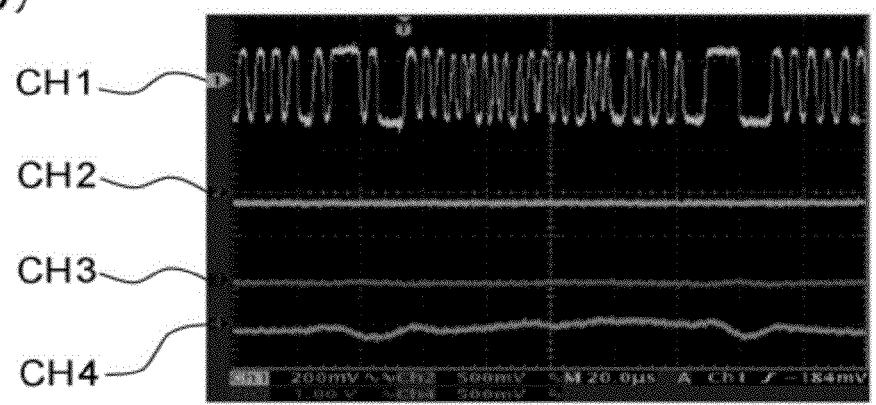

FIG. 15 shows the results of disk servo evaluation. Wave forms of a tracking error signal when focus is ON, a focus error signal and a tracking error signal when servo is ON, a RF (Radio Frequency: RF, high frequency) signal and an address signal were observed at an inner circumference of the disk (radius of 25 mm=585 tracks), an intermediate circumference of the disk (radius of 40 mm=9,960 tracks) and an outer circumference of the disk (radius of 55 mm=19,335 tracks).

As a result, there was no problem with the wave forms, and the wave forms were satisfactory with respect to each signal of CH1: RF signal, CH2: focus center position signal, CH3: focus error signal, and CH4: tracking error.

Namely, a surface deviation of CH$_2$: focus center position signal is within about 10 μm (equivalent to DVD) when converted from a current value of 500 mV. In addition, CH4: tracking error is from 25 to 30 μm (CD: 70 μm), and the results are satisfactory.

Example 7

A composition for a fluorine-containing holographic data recording material was prepared in the same manner as in Example 1 except that 1 g of propylene glycol 400

INDUSTRIAL APPLICABILITY

In the volume holographic data recording media of the present invention, recording density of the hologram recording layer, namely, shift selectivity of the recording media, can be improved by optical recording of holographic data with a specific amount of spatial shift distance. Especially when a specific fluorine-containing recording material is used, high density is expectable, and it is expected that the recording media of the present invention having sensitivity with a wavelength in a visible region can replace conventional archival systems including tape media.

The invention claimed is:

1. Volume holographic data recording media having a recording layer being capable of recording interference fringes generated by interference of light having excellent coherence as fringes having different refractive indexes,
   wherein an amount of spatial shift distance of holograms recorded on the recording layer is from 0.1 μm to 3 μm,
   at least two holograms with a spatial shift of less than 3 μm are recorded in the medium, and
   a composition used for the recording layer comprises a fluorine-containing polymer.

2. The volume holographic data recording media of claim 1, wherein the composition used for the recording layer comprises the fluorine-containing polymer (a), a liquid monomer (b) and a photo-initiator (c), said fluorine-containing polymer (a) is a non-crystalline polymer comprising a fluorine-containing monomer as a structural unit and having a fluorine content of from 26 to 80% by mass, said liquid monomer (b) comprises at least one kind of liquid monomer (b1) initiating polymerization due to activated species generated from the photo-initiator (c), said photo-initiator (c) is a compound which is sensitized with light having excellent coherence, thereby initiating polymerization of the liquid monomer (b1), and a refractive index of the liquid monomer (b) is higher than an average refractive index of a mixture of the fluorine-containing polymer (a) and the photo-initiator (c).

3. The volume holographic data recording media of claim 1, wherein the amount of spatial shift distance of holograms recorded on the recording layer is from 0.3 µm to 3 µm.

4. The volume holographic data recording media of claim 1, wherein the upper limit of the amount of spatial shift distance of holograms recorded on the recording layer is less than 3 µm.

5. The volume holographic data recording media of claim 1, wherein the upper limit of the amount of spatial shift distance of holograms recorded on the recording layer is not more than 1 µm.

6. Volume holographic data recording media having a reflecting layer and a recording layer on a substrate, wherein a servo pit pattern is formed on the reflecting layer, a pit length is less than 2 µm, an amount of spatial shift distance of holograms recorded on the recording layer is from 0.1 µm to 3 µm, and a composition used for the recording layer comprises a fluorine-containing polymer.

7. The volume holographic data recording media of claim 6, wherein the composition used for the recording layer comprises the fluorine-containing polymer (a), a liquid monomer (b) and a photo-initiator (c), said fluorine-containing polymer (a) is a non-crystalline polymer comprising a fluorine-containing monomer as a structural unit and having a fluorine content of from 26 to 80% by mass, said liquid monomer (b) comprises at least one kind of liquid monomer (b1) initiating polymerization due to activated species generated from the photo-initiator (c), said photo-initiator (c) is a compound which is sensitized with light having excellent coherence, thereby initiating polymerization of the liquid monomer (b1), and a refractive index of the liquid monomer (b) is higher than an average refractive index of a mixture of the fluorine-containing polymer (a) and the photo-initiator (c).

8. The volume holographic data recording media of claim 6, wherein the amount of spatial shift distance of holograms recorded on the recording layer is from 0.3 µm to 3 µm.

9. The volume holographic data recording media of claim 6, wherein the upper limit of the amount of spatial shift distance of holograms recorded on the recording layer is less than 3 µm.

10. The volume holographic data recording media of claim 6, wherein the upper limit of the amount of spatial shift distance of holograms recorded on the recording layer is not more than 1 µm.

* * * * *